United States Patent [19]

Mashita

[11] Patent Number: 5,425,811
[45] Date of Patent: Jun. 20, 1995

[54] APPARATUS FOR MANUFACTURING A NITROGEN CONTAINING COMPOUND THIN FILM

[75] Inventor: Masao Mashita, Yokohama, Japan

[73] Assignee: Kabushiki Kaisha Toshiba, Kawasaki, Japan

[21] Appl. No.: 969,358

[22] Filed: Oct. 30, 1992

[30] Foreign Application Priority Data

Oct. 30, 1991 [JP] Japan .................. 3-284773

[51] Int. Cl.$^6$ .............................. C23C 16/50
[52] U.S. Cl. .................. 118/723 MP; 118/723 ER; 118/723 IR; 118/722; 118/726
[58] Field of Search ...... 118/723, 722, 715, 723 MW, 118/723 ME, 723 MR, 723 MA, 723 MP, 723 I, 723 IR, 726; 427/561

[56] References Cited

U.S. PATENT DOCUMENTS

| | | |
|---|---|---|
| 4,160,161 | 7/1979 | Horton . |
| 4,810,935 | 3/1989 | Boswell .................. 315/111.41 |
| 4,898,118 | 2/1990 | Murakami et al. .......... 118/723 ME |
| 5,269,848 | 12/1993 | Nakagawa .................. 118/723 |

FOREIGN PATENT DOCUMENTS

| | | | |
|---|---|---|---|
| 62-254432 | 11/1987 | Japan .................. 118/722 |
| 63-303889 | 12/1988 | Japan . | |
| 01-92375 | 4/1989 | Japan .................. 118/723 |
| WO90/08210 | 7/1990 | WIPO . | |

OTHER PUBLICATIONS

Patent Abstracts of Japan, vol. 10, No. 313, (E-448)(2369), Oct. 24, 1986, JP-A-61 124 028, Jun. 11, 1986, K. Hashimoto, et al., "Ion Source".
JOurnal of Crystal Growth, vol. 86, No. 1-4, Jan. 1, 1988, p. 329-334, K. Okawa, et al., "Molecular Beam Epitaxial Growth of Nitrogen-Doped Znse with Ion Doping Technique".
Patent Abstracts of Japan, vol. 10, No. 303, (C-378)(2359), Oct. 16, 1986, JP-A-61 117 199, Jun. 4, 1986, T. Suzuki, "Method for Growing Crystal".
IBM Technical Disclosure Bulletin, vol. 27, No. 5, Oct. 1984, p. 3099, J. J. Cuomo, et al., "Microwave Stimulated Ion Source".
Nulear Instruments and Methods in Physics Research.-Section B, vol. B6, No. 1/2, Jan. 1985, pp. 119-122, E. Yabe, et al., "An Ion Source with Plasma Generator".
Patent Abstracts of Japan, vol. 13, No. 137, (C-582)(3485) Apr. 5, 1989, JP-A-63 303 889, Dec. 12, 1988, T. Mitsuyu, et al., "Device For Producing Semiconductor Crystal Thin Film".

*Primary Examiner*—Robert Kunemund
*Assistant Examiner*—Jonathan D. Baskin
*Attorney, Agent, or Firm*—Oblon, Spivak, McClelland, Maier & Neustadt

[57] ABSTRACT

An apparatus for forming a II-VI Group compound thin film containing nitrogen as an impurity, on a substrate, comprises a container for holding a substrate, a vapor source for supplying Zn vapor on a surface of the substrate, a vapor source for supplying Se vapor on the surface of the substrate, and a discharge tube into which a nitrogen gas is introduced, having three-divided internal portions, a high-pressure portion, a middle-pressure portion, and a low-pressure portion from the gas introduction side, and supplying excitation species derived from discharge plasma generated in the low-pressure portion onto the surface of the substrate. Zn vapor and Se vapor are alternately supplied, and supply of nitrogen excitation species is performed in synchronous with supply of Zn vapor.

19 Claims, 4 Drawing Sheets

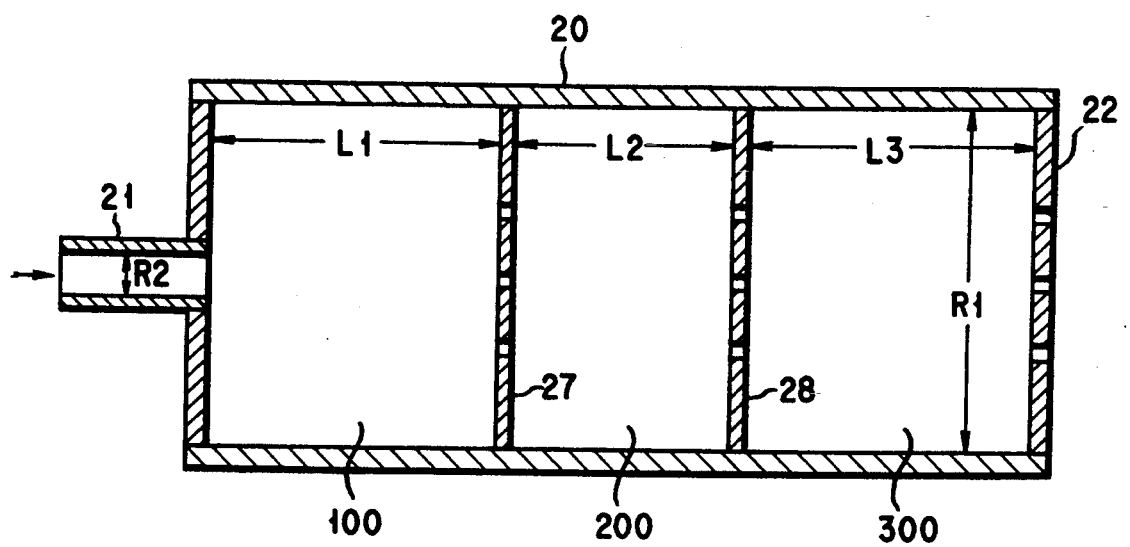
F I G. 3A
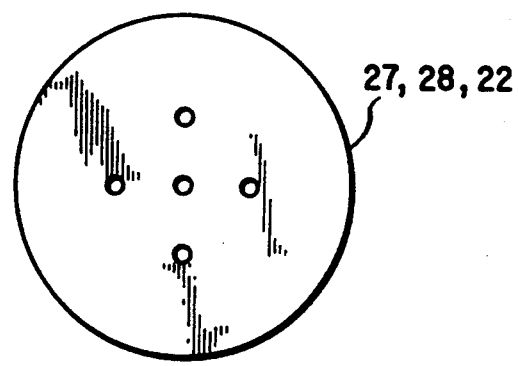
F I G. 3B

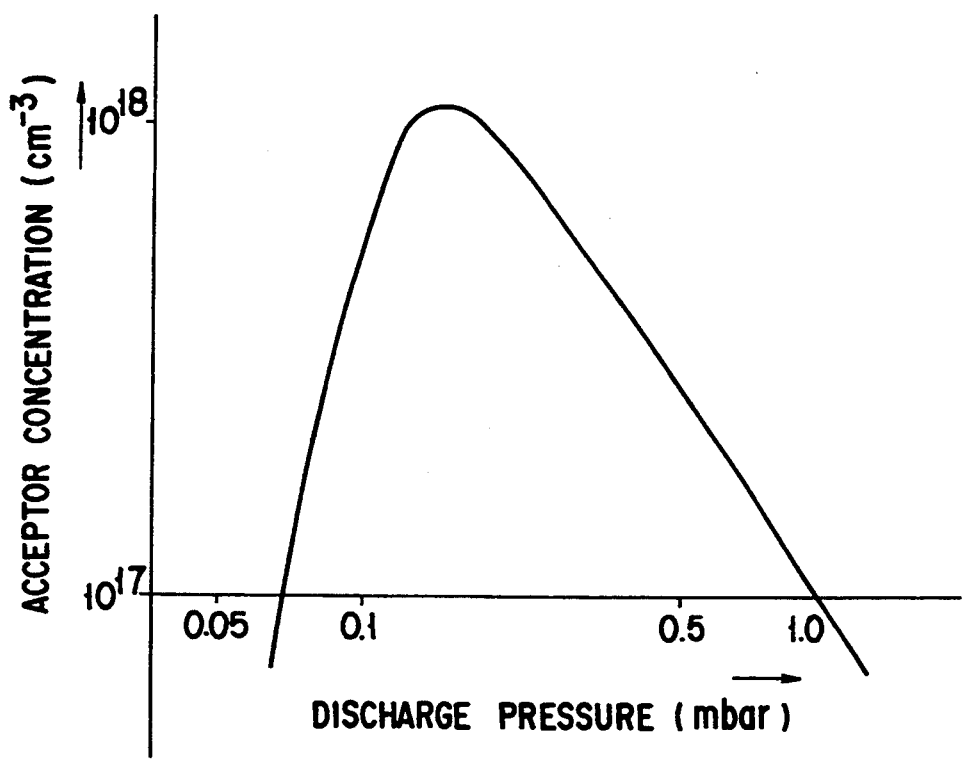
F I G. 4
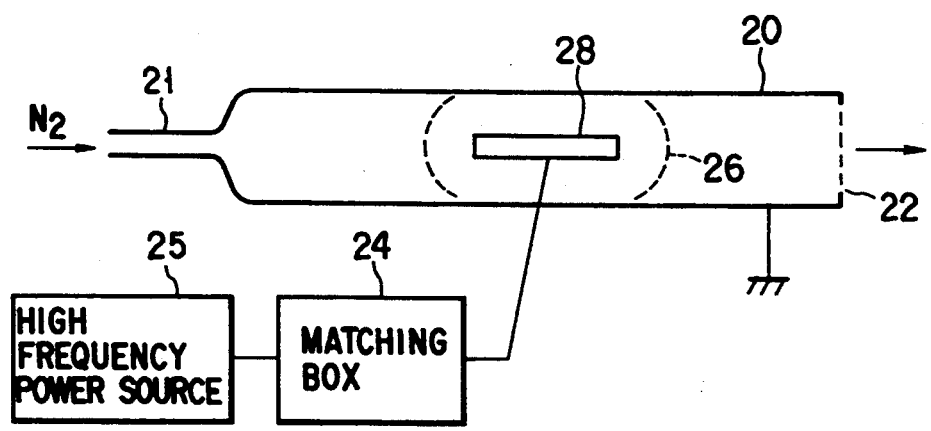
F I G. 5

APPARATUS FOR MANUFACTURING A NITROGEN CONTAINING COMPOUND THIN FILM

BACKGROUND OF THE INVENTION

1. Field of the Invention

The present invention relates to a technique of manufacturing a compound thin film, more specifically, a method of depositing a nitrogen-containing compound thin film on a substrate, and an apparatus of manufacturing the same.

2. Description of the Related Art

Conventionally, it is difficult to grow a nitrogen compound in a vacuum, or to dope nitrogen into a semiconductor thin film during growth thereof, because nitrogen and nitrogen compounds are chemically stable and rarely react with the growing surface of the thin film during the growth. Consequently, it is difficult to obtain a p-type conductor by doping nitrogen into a II-VI Group compound semiconductor.

A II-VI Group compound semiconductor made of a group II device such as Cd or Zn, and a group VI device such as S or Se, is a good material for manufacturing a light emitting device. In the case of ZnSe, for example, doping nitrogen into the compound is known to be effective to make an acceptor. However, even if nitrogen gas or ammonia gas is introduced during molecular beam epitaxial growth (MBE) of ZnSe, hardly any nitrogen is absorbed into the film, because of the low reactivity of each of the gases. Consequently, with the conventional technique, it is not possible to make an acceptor so good as to achieve a sufficient p-type conductivity (see J. Appl. Phys., vol.58, pp1047-1049).

As described, conventionally, there is a drawback wherein nitrogen cannot be sufficiently absorbed into a compound film during growth thereof, because generally nitrogen and nitrogen compounds are chemically stable. In particular, although nitrogen is doped into a compound to achieve a p-type conductivity, it is difficult to carry out sufficient doping in the case of an II-VI Group compound semiconductor, in particular. Therefore, it is difficult to make a good p-n junction.

SUMMARY OF THE INVENTION

The present invention has been developed in consideration of the above drawback, and the object thereof is to provide a method of manufacturing a nitrogen-containing compound thin film, in which nitrogen can be effectively incorporated into the compound thin film during the growth, and contribute to converting an II-VI Group compound semiconductor to a p-type conductivity semiconductor, and an apparatus for manufacturing such a semiconductor.

In order to achieve the object, there is provided an apparatus for forming a nitrogen-containing compound thin film on a substrate, comprising: a container for holding the substrate; means for supplying material vapor to the substrate held in the container; and a discharge tube into which a gas containing at least nitrogen is introduced, having two-divided internal portions, a high-pressure portion on a gas introduction side and a low-pressure portion on a gas discharge side, and supplying excitation species derived from discharge plasma generated in the low-pressure portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3A is a cross section of a specific structure of a discharge tube;

FIG. 3B is a plan view showing the arrangement pattern of pin holes made in a partition plate and lid;

FIG. 4 is a characteristic diagram showing the relationship between the discharge pressure in the discharge tube, and the acceptor concentration;

FIG. 5 is a diagram showing another structure of the excitation nitrogen beam source;

DETAILED DESCRIPTION OF THE PREFERRED EMBODIMENTS

Embodiments of the invention will be described in detail with reference to accompanying drawings.

Figure 1:
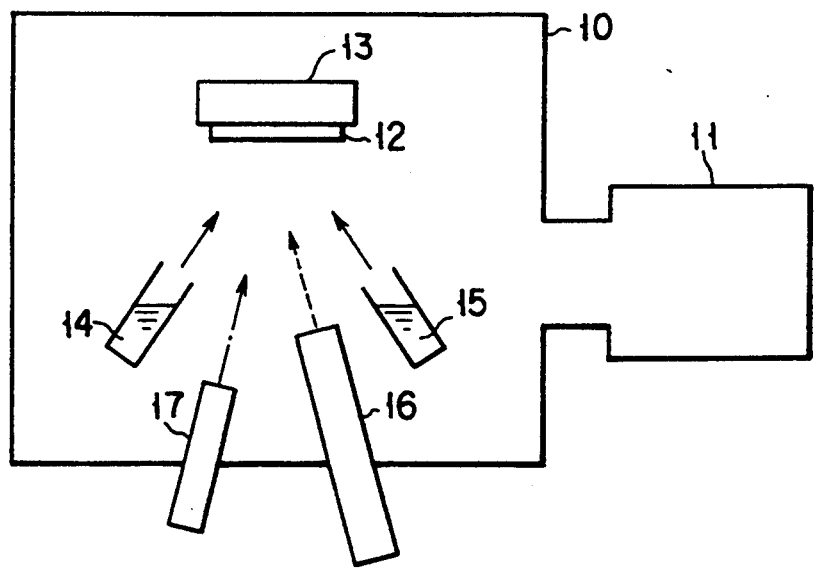
FIG. 1 is a schematic view showing a structure of an MBE (molecular beam epitaxy) apparatus according to an embodiment of the invention.

FIG. 1 is a schematic view showing a cross section of a structure of an MBE (molecular beam epitaxy) apparatus according to an embodiment of the invention. This figure depicts an ultrahigh vacuum container 10, and an ultrahigh vacuum exhausting system 11 connected thereto. In the upper portion of the container 10, a substrate heating mechanism 13 is provided for supporting the substrate and raising the temperature thereof. Underneath the substrate heating mechanism 13 in the container 10, a plurality of vapor sources 14 and 15 each having an opening on the substrate side (upper side) are arranged.

The above-described structure is common to the present invention and the conventional apparatus. In addition, the embodiment of the invention further includes an excitation nitrogen beam source 16 for irradiating excitation nitrogen beams onto the surface of the substrate 12, and a light introduction mechanism 17 for irradiating UV light guided from an optical system onto the surface of the substrate 12.

A method of producing a compound thin film by use of the above apparatus will now be described.

The vapor sources 14 and 15 are filled with high-purity Zn and Se, respectively. Then, a GaAs substrate having a plane orientation of (100), namely, a substrate 12, the surface of which was cleaned, is placed to the substrate heating mechanism 13. The pressure in the container 10 is exhausted by the vacuum exhausting system 11 to $10^{-10}$ Torr. With the shutter of each of the vapor sources 14 and 15 closed, the vapor sources are heated such that they have a vapor amount sufficient for growth of ZnSe. It should be noted that a preferable ratio of Zn to Se in vapor amount is about 1:3.

When the vapor sources 14 and 15 are ready, the substrate 12 is heated to 550° C. so as to vaporize oxides in the surface portion of the substrate. Then, the substrate 12 is cooled down to a growth temperature, for example, 300° C., and the shutter of each of the vapor sources 14 and 15 is open to initiate the growth. At the same time, the excitation nitrogen beam source 16 is driven to irradiate nitrogen excitation species ($N^+$, $N_2^+$, N, $N_2$) onto the growing surface of ZnSe thin film crystals.

Figure 2:
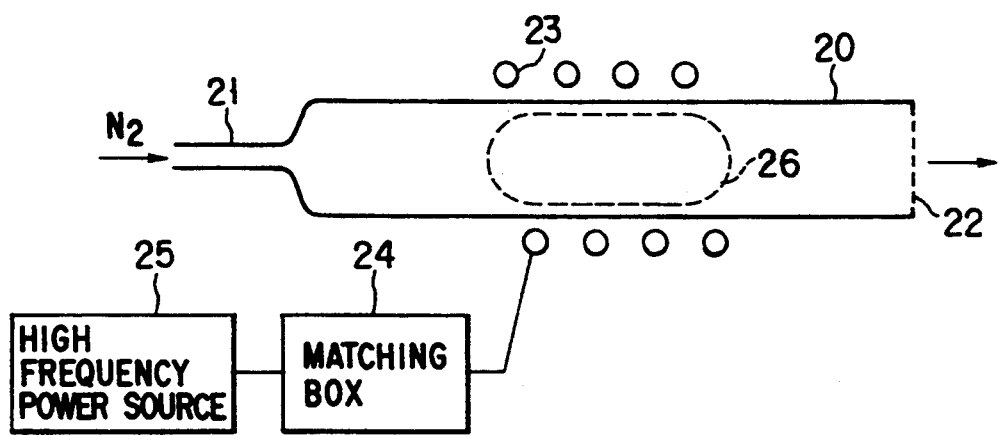
FIG. 2 is a diagram showing a basic structure of an excitation nitrogen beam source employed in this embodiment.

The excitation nitrogen beam source 16 employed here has a structure as shown in FIG. 2. As can be seen in the figure, a pipe 21 is connected to one end of a discharge tube 20 to introduce nitrogen gas thereinto, and the other end of the tube 20 is covered by a lid 22 having pin holes. The discharge tube 20 is made of BN (PBN) or quartz glass by a thermal decomposition method. The diameter of the tube is, for example, about 50 mm. A pipe is wound around the discharge tube 20 to form an RF coil 23, and an RF power source 25 is connected to the RF coil 23 via a matching box 24.

The inside of the discharge tube 20 is divided into three chambers by means of partition plates 27 and 28 each having pin holes, as shown in FIG. 3A. These chambers form a high pressure portion 100, a middle pressure portion 200, and a low pressure portion 300, in the mentioned order from the gas introduction side.

The size of each of the members actually used in the embodiment will be listed. The inner diameter ($R_1$) of the discharge tube 20 was set to 50 mm, that of the pipe 21 ($R_2$) to 5 mm, the length L1 of the high pressure portion 100 to 45 mm, the length L2 of the middle pressure portion 200 to 35 mm, and the length L3 of the low pressure portion 300 to 45 mm. Further, the diameters of the pin holes are about 1 mm for the plate 27, and about 2 mm for the plate 28 and the lid 22. The number of pin holes was about 5 for all of them. The pin holes are provided in each of the partition plates 27, 28 and the lid 22, symmetrically with respect to the center portion, as shown in FIG. 3B. With the above-described compartmentalized structure, nitrogen excitation species can be effectively generated in the low pressure portion 300 while maintaining a stable discharge in the high pressure portion 100.

In the excitation nitrogen beam source 16, nitrogen gas is supplied from the pipe 21 into the discharge tube 20 at a rate of 0.2-2 cc/min, and an RF power of a frequency of 13.56 MHz is supplied to the RF coil 23. The power supply was 300-500 W. Thus, discharge plasma 26 is generated in the discharge tube 20, and chemical species excited in the plasma are ejected out of the discharge tube 20 through the lid 22 toward the substrate 12.

It is particularly of importance that nitrogen excitation species are generated at a high efficiency, and well doped into growing ZnSe crystals to create a sufficient number of acceptors. The authors of the invention conducted an experiment in connection with the above, and found that as the discharge pressure varied, the acceptor concentration significantly varied. FIG. 4 shows the relationship between the discharge pressure and the acceptor concentration. This figure indicates a great dependency of the acceptor concentration on the discharge pressure, and the discharge pressure should most preferably be in the range of 0.1-0.3 mbar. Further, in order to achieve an acceptor concentration of $10^{17}$ cm$^{-3}$ or higher, which is a criterion for a regular p-type semiconductor apparatus, the discharge pressure should be in the range of 0.07-1 mbar.

Although a discharge pressure of 0.07-1 mbar usually makes an unstable discharge, the embodiment can efficiently release useful nitrogen excitation species under a stable discharge condition, because the discharge 20 is divided into chambers including the high pressure portion 100 where a discharge is stably maintained, and the low pressure portion 300 where nitrogen excitation species useful to create acceptors are efficiently generated. When the flow amount of nitrogen, and the power of the RF coil 23 were set to 1 sccm, and 500 W, respectively, the pressure in the high pressure portion 100 was 10 mbar, at which a discharge can be stabilized, that of the middle pressure 200 was 1.0 mbar, and that of the low pressure portion 300 was 0.15 bar, which is in the mentioned preferable range.

Further, the middle pressure portion 20 is not essential to the embodiment, and it was confirmed from a test that a discharge tube compartmentalized into a high pressure portion and a low pressure portion (without having a middle pressure portion) had results similar to those of the embodiment. It was further revealed that a stable discharge could be maintained by setting the volume of the high pressure portion 100 to 30-50% of the whole.

Thus obtained N-doped ZnSe film exhibited light from excitation species bound with acceptors having a peak energy of 2.790 eV at a photoluminescence of 10K, significantly brighter than that of the case where only nitrogen gas is introduced during growth of the film. Further, the obtained N-doped ZnSe film had a positive hole concentration of $5 \times 10^{17}$ cm$^{-3}$, indicating a p-type conductivity, whereas the film obtained by introducing only nitrogen gas had an n-type conductivity.

Examples of the discharge gas are nitrogen-containing compounds which is more decomposable than nitrogen and generates excitation species such as $NH_m(CH_3)_{3-m}$, $NH_m(C_2H_5)_{3-m}$, $(CH_3)_{4-n}$, and $N_2H_n(C_2H_5)_{4-n}$ (m=0, 1, 2, 3, n=0, 1, 2, 3, 4). With any of these compound gases, the generation efficiency of nitrogen-containing excitation species greatly depends on the discharge condition, and (therefore) an arc discharge is preferable. Since any of these compound gases was more generous than nitrogen gas in generating excitation species, a sufficient acceptor concentration could be obtained within a pressure range wider than that mentioned above.

In order to increase the nitrogen-incorporation rate, it was effective to irradiate nitrogen excitation species and UV light having a wavelength of 300 nm or less onto the growing surface at the same time. This is because the excitation species adsorbed on the surface absorb UV light, enhancing the decomposition reaction.

Other than the one shown in FIG. 2, another advantageous structure of the excitation nitrogen beam source 16 is shown in FIG. 5, wherein an electrode 28 is placed within the discharge space. A discharge is carried out between the electrode 28 and the discharge tube 20, and therefore if the discharge tube 20 is formed of a conductive material, all should be done is to ground the discharge tube. Since the electrode 28 is exposed to plasma, it is spattered. When the material of the electrode and the enclosure of the discharge material 20 is made of Zn, or these members are coated with Zn, contamination of the ZnSe growing thin film with impurities can be prevented. Further, since chemical species having Zn—N bonds are emitted from the excitation nitrogen beam source 16, nitrogen is effectively doped into the film. In addition, there is a more active way to generate chemical species. That is, by use of a mixture gas of nitrogen, or a nitrogen compound and a Zn compound such as $Zn(CH_3)_2$ as a discharge gas, chemical species including Zn—N bonds can be generated at a high efficiency.

Figure 6:
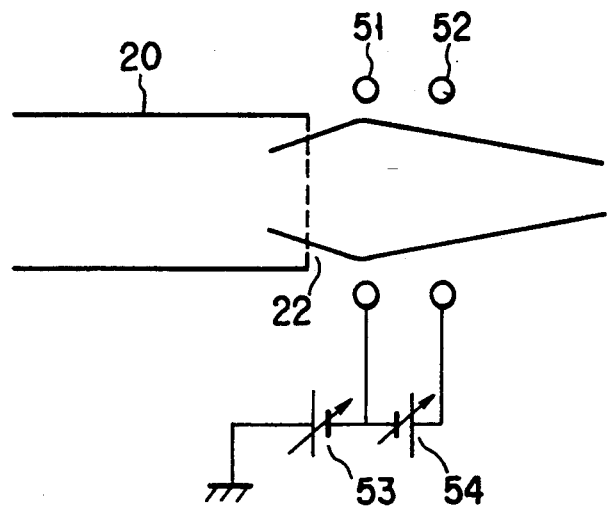
FIG. 6 is a diagram showing a main structure of an excitation nitrogen beam source comprising ion control electrodes.
Figure 7:
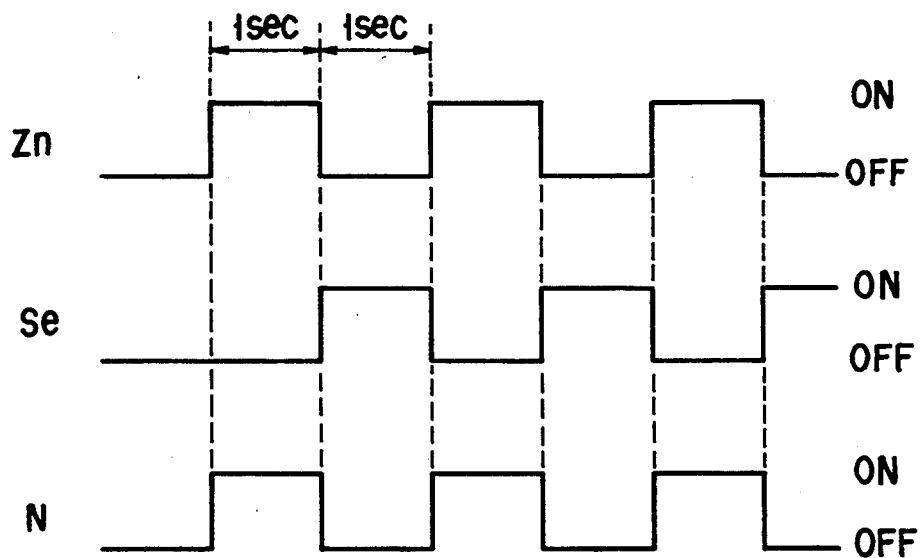
FIG. 7 is a diagram showing timings for driving the Zn vapor source, the Se vapor source, and the excitation nitrogen beam source.

In the case where excitation species emitted from the excitation nitrogen beam source 16 are ions, control electrodes 51 and 52 should preferably be provided in front of the excitation species discharge outlet of the discharge tube 20 as shown in FIG. 6 so as to avoid divergence of excitation species and irradiate the species on the substrate 12 at a high concentration. DC power sources 53 and 54 are connected to the electrodes 51 and 52, respectively, and the electrode 51 is set to a potential lower than that of the electrode 52. Potentials are selected so that excitation species beams uniformly strike substrate. The control electrodes 51 and 52 are useful to control the energy of the excitation species. If the energy is too high, grown crystals are likely to be made defective, degrading the characteristics of the thin film product, whereas if the energy is too low, nitrogen atoms are not effectively incorporated.

As described, in this embodiment, during growth of ZnSe on the substrate 12, nitrogen excitation species derived from the discharge plasma 26 generated in the discharge tube 20 are irradiated on the growing surface, and therefore nitrogen can be sufficiently introduced into the growing ZnSe thin film. Consequently, a p-type conductive ZnSe thin film, an excellent material for making a ZnSe semiconductor light-emitting device, can be obtained. Further, with an appropriate discharge pressure, an appropriate type of gas, and introduction of appropriate Uv light, the doping amount of nitrogen into the ZnSe thin film can be increased to a sufficient level. In particular, the discharge tube 20 has a compartmentalized structure; therefore a stable discharge can be maintained in the high pressure portion 100, and generation of nitrogen excitation species can be carried out at a high efficiency in the low pressure portion 300.

Another embodiment of the invention will now be described.

In the above-described embodiment, a thin film is grown while supplying vapor materials at the same time; however in the case where nitrogen absorbed into the thin film makes a special chemical bond, or a special arrangement in a crystal, materials other than nitrogen may be supplied one at a time, and irradiation of nitrogen excitation species may be conducted during a particular time.

More specifically, in this embodiment, at a substrate temperature of 250° C., ZnSe is grown on the surface as the shutters of the Zn vapor source 14 and Se vapor source 15 are opened one at a time for one second. As the shutter of the Zn vapor source 14 is opened (ON), the excitation nitrogen beam source 16 is driven (ON) for one second so as to make nitrogen excitation species adsorbed on the surface of the substrate, thereby preferentially forming Zn—N bonds. After that, the shutter of the Se evaporation source 15 is opened for one second (ON); however the excitation nitrogen beam source 16 is not driven during this time.

As described, in this embodiment, a Zn—N layer and Se layer are formed one on another on an substrate, and therefore nitrogen can be doped into the Se site effectively. Consequently, the positive hole concentration of the ZnSe can be increased, thereby forming a p-type conductive thin film. Further, with this technique of supplying material vapors one at a time, a high photoluminescence intensity, and a high N-doping efficiency can be achieved despite of a low growing temperature.

It should be noted that the present invention is not limited to the embodiments described above. In the embodiments, nitrogen is doped into ZnSe; however doping of nitrogen can be performed onto other compound thin film, such as a II-VI Group compound semiconductor thin film. Further, the invention can be applied not only to N-doping into a II-VI Group compound semiconductor thin film, but also a technique for manufacturing a general nitrogen compound thin film. Lastly, as long as the essence of the invention remains, the invention may be remodeled into various types of embodiments.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for forming a nitrogen-containing compound thin film on a substrate, comprising:
   a container for holding the substrate;
   means for supplying material vapor onto a surface of the substrate held in the container; and
   a discharge tube into which a gas containing at least nitrogen is introduced, having at least two-divided internal portions in both which discharge is carried out, a high-pressure portion on a gas introduction side and a low-pressure portion on a gas discharge side, and supplying excitation species derived from discharge plasma generated in the low-pressure portion onto a surface of said substrate, said discharge tube including a partition plate dividing said discharge tube such that an internal portion on one side of said partition plate has a pressure higher than that in an internal portion on another side of said partition plate.

2. An apparatus according to claim 1, wherein the gas introduced into said discharge tube is a nitrogen gas.

3. An apparatus according to claim 1, wherein the gas introduced into said discharge tube is a nitrogen-containing compound gas.

4. An apparatus according to claim 1, wherein the gas introduced into said discharge tube is a mixture gas of one of nitrogen and nitrogen compound, and a non-nitrogen compound constituting a growing thin film.

5. An apparatus according to claim 1, wherein a pressure in the low pressure portion of said discharge tube is set to 0.07–1 mbar.

6. An apparatus according to claim 1, wherein said discharge tube has a middle pressure portion between the high and low pressure portions, and the pressure in the low pressure portion of said discharge tube is set to 0.07–1 mbar.

7. An apparatus according to claim 1, wherein an inner wall of said discharge tube is made of the same material as that contained in the compound thin film to be grown.

8. An apparatus according to claim 1, further comprising means for irradiating UV light on a surface of said substrate.

9. An apparatus for forming a II-VI Group compound thin film containing nitrogen as an impurity, on a substrate, comprising:
- a container for holding the substrate;
- means for supplying II group material vapor and VI group material vapor alternately to a surface of the substrate held in the container; and
- a discharge tube into which a gas containing at least nitrogen is introduced, having at least two-divided internal portions, a high-pressure portion on a gas introduction side and a low-pressure portion on a gas discharge side, and means for supplying excitation species derived from discharge plasma generated in the low-pressure portion onto a surface of said substrate in synchronous with supply of said II group material vapor.

10. An apparatus according to claim 9, wherein the gas introduced into said discharge tube is a nitrogen gas.

11. An apparatus according to claim 9, wherein the gas introduced into said discharge tube is a nitrogen-containing compound gas.

12. An apparatus according to claim 9, wherein the gas introduced into said discharge tube is a mixture gas of one of nitrogen and nitrogen compound, and a non-nitrogen compound constituting a growing thin film.

13. An apparatus according to claim 9, wherein a pressure in the low pressure portion of said discharge tube is set to 0.07-1 mbar.

14. An apparatus according to claim 9, wherein said discharge tube has a middle pressure portion between the high and low pressure portions, and the pressure in the low pressure portion of said discharge tube is set to 0.07-1 mbar.

15. An apparatus according to claim 9, wherein an inner wall of said discharge tube is made of the same material as that contained in the compound thin film to be grown.

16. An apparatus according to claim 9, further comprising means for irradiating UV light on a surface of said substrate.

17. An apparatus for forming a nitrogen-containing compound thin film on a substrate, comprising:
- a container for holding the substrate;
- a plurality of vapor sources in said container;
- means for supplying material vapor onto a surface of the substrate held in the container; and
- a discharge tube into which a gas containing at least nitrogen is introduced, having at least two-divided internal portions, a high-pressure portion on a gas introduction side and a low-pressure portion on a gas discharge side, and supplying excitation species derived from discharge plasma generated in the low-pressure portion onto a surface of said substrate,
- wherein said means for supplying material vapor comprise means for supplying a II Group material vapor and a VI Group material vapor.

18. An apparatus for forming a nitrogen-containing compound thin film on a substrate, comprising:
- a container for holding the substrate;
- means for supplying material vapor onto a surface of the substrate held in the container; and
- a discharge tube into which a gas containing at least nitrogen is introduced, having at least two-divided internal portions, a high-pressure portion on a gas introduction side and a low-pressure portion on a gas discharge side, and supplying excitation species derived from discharge plasma generated in the low-pressure portion onto a surface of said substrate,
- wherein an inner wall of said discharge tube is made of the same material as that contained in the compound thin film to be grown.

19. An apparatus for forming a nitrogen-containing compound thin film on a substrate, comprising:
- a container for holding the substrate;
- means for supplying material vapor onto a surface of the substrate held in the container;
- a discharge tube into which a gas containing at least nitrogen is introduced, having at least two-divided internal portions, in both of which discharge is carried out a high-pressure portion on a gas introduction side and a low-pressure portion on a gas discharge side, and supplying excitation species derived from discharge plasma generated in the low-pressure portion onto a surface of said substrate; and
- means for irradiating UV light on a surface of said substrate.

* * * * *